(12) United States Patent
Ling et al.

(10) Patent No.: US 12,727,295 B2
(45) Date of Patent: Sep. 1, 2026

(54) MOUNTING ARRANGEMENTS FOR SEMICONDUCTOR PACKAGES AND RELATED METHODS

(71) Applicant: CreeLED, Inc., Durham, NC (US)

(72) Inventors: Timothy Ling, Raleigh, NC (US); Ryan Mohn, Mebane, NC (US); David N. Randolph, Wake Forest, NC (US); David Peoples, Raleigh, NC (US); Wooh Jae Kim, Cary, NC (US)

(73) Assignee: CreeLED, Inc., Durham, NC (US)

( * ) Notice: Subject to any disclaimer, the term of this patent is extended or adjusted under 35 U.S.C. 154(b) by 438 days.

(21) Appl. No.: 17/656,591

(22) Filed: Mar. 25, 2022

(65) Prior Publication Data

US 2023/0307586 A1 Sep. 28, 2023

(51) Int. Cl.
*H10H 20/85* (2025.01)
*H10H 20/01* (2025.01)
(Continued)

(52) U.S. Cl.
CPC ........ *H10H 20/8506* (2025.01); *H10W 70/65* (2026.01); *H10W 72/07336* (2026.01); *H10W 90/734* (2026.01)

(58) Field of Classification Search
CPC ............. H01L 33/486; H01L 23/49838; H01L 2224/83815; H01L 2224/81143; H01L 25/0753
See application file for complete search history.

(56) References Cited

U.S. PATENT DOCUMENTS

2010/0123163 A1* 5/2010 Ohtorii .................. H01L 24/83 257/E33.056
2012/0193661 A1 8/2012 Emerson et al.
(Continued)

FOREIGN PATENT DOCUMENTS

CN 104952746 B * 3/2018 .......... H10W 90/701
EA 010269 B1 * 6/2008

OTHER PUBLICATIONS

Taran et al—Translated (Year: 2008).*
(Continued)

*Primary Examiner* — Joshua Benitez Rosario
*Assistant Examiner* — Moataz Khalifa
(74) *Attorney, Agent, or Firm* — Withrow & Terranova, P.L.L.C.

(57) ABSTRACT

Semiconductor packages and more particularly mounting arrangements for semiconductor packages and related methods are disclosed. Mounting arrangements include metal pads on substrates and selectively placed solder material on various portions of the metal pads. Semiconductor packages may be initially positioned on the solder material and on portions of the metal pads. During solder reflow, the solder material may spread along portions of the metal pads that were previously uncovered by the solder material and effectively move the semiconductor packages. Specific arrangements of metal pad and selective solder material patterns may be provided that control directions of such movements during reflow. Resulting mounting positions of semiconductor packages may be provided with spacings that are closer than limits of pick and place equipment used to initially position the semiconductor packages.

17 Claims, 10 Drawing Sheets

(51) Int. Cl.

| | |
|---|---|
| ***H10H 20/857*** | (2025.01) |
| ***H10W 70/65*** | (2026.01) |
| ***H10W 72/00*** | (2026.01) |
| ***H10W 72/30*** | (2026.01) |
| ***H10W 90/00*** | (2026.01) |

(56) References Cited

U.S. PATENT DOCUMENTS

2014/0110752 A1* 4/2014 Fujino .................... H01L 24/32 257/133
2015/0228873 A1* 8/2015 Gebuhr .............. H10H 20/8506 174/536
2016/0252688 A1* 9/2016 Barwicz .................. H01L 24/00 385/14
2017/0103966 A1* 4/2017 Choi ...................... H05K 1/111
2018/0190614 A1* 7/2018 Kumar .................... H01L 24/98
2021/0043817 A1 2/2021 Liang et al.

OTHER PUBLICATIONS

Marbella—Translated (Year: 2018).*
International Search Report and Written Opinion for International Patent Application No. PCT/US2023/016005, mailed Jul. 4, 2023, 15 pages.
Examination REport for European Patent Application No. 23718108.6, mailed Jun. 30, 2026, 6 pages.

* cited by examiner

MOUNTING ARRANGEMENTS FOR SEMICONDUCTOR PACKAGES AND RELATED METHODS

FIELD OF THE DISCLOSURE

The present disclosure relates to semiconductor packages and more particularly to mounting arrangements for semiconductor packages and related methods.

BACKGROUND

Semiconductor technology can sometimes involve arranging various discrete semiconductor packages together on a common substrate, such as a printed circuit board. Depending on the particular application, various discrete packages may together form integrated circuits or modules that include larger arrays of semiconductor packages. For surface mount technology applications, semiconductor packages are typically directly mounted and electrically connected to metallization on the common substrate.

In solid-state lighting applications, discrete light-emitting diode (LED) packages are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources. In various applications, discrete LED packages are commonly arranged together on common substrates, such as printed circuit boards to form arrays of LED packages for increased light output or for applications where LED packages having different emission colors are assembled together.

The art continues to seek improved LEDs and solid-state lighting devices having desirable illumination characteristics capable of overcoming challenges associated with conventional lighting devices.

SUMMARY

The present disclosure relates to semiconductor packages and more particularly to mounting arrangements for semiconductor packages and related methods. Mounting arrangements include metal pads on substrates and selectively placed solder material on various portions of the metal pads. Semiconductor packages may be initially positioned on the solder material and on portions of the metal pads. During solder reflow, the solder material may spread along portions of the metal pads that were previously uncovered by the solder material and effectively move the semiconductor packages. Specific arrangements of metal pad and selective solder material patterns may be provided that control directions of such movements during reflow. Resulting mounting positions of semiconductor packages may be provided with spacings that are closer than limits of pick and place equipment used to initially position the semiconductor packages.

In one aspect, a method comprises: providing a substrate with a first metal pad and a second metal pad; selectively applying a solder material to a portion of the first metal pad and a portion of the second metal pad; mounting a first semiconductor package to the solder material of the first metal pad and a second semiconductor package to the solder material of the second metal pad, wherein the second semiconductor package is laterally spaced from the first semiconductor package by a first distance; and reflowing the solder material such that the solder material of the first metal pad spreads along the first metal pad and the solder material of the second metal pad spreads along the second metal pad such that the first semiconductor package is laterally spaced from the second semiconductor package by a second distance that is less than the first distance. In certain embodiments, the first semiconductor package and the second semiconductor package comprise light-emitting diode (LED) packages. In certain embodiments, the LED packages are configured as surface mount technology (SMT) packages. In certain embodiments, the first semiconductor package and the second semiconductor package comprise at least one of a capacitor, a resistor, a transistor, and a microchip. In certain embodiments, the second distance is less than or equal to 100 microns (μm). In certain embodiments, the second distance is less than or equal to 50 microns (μm). In certain embodiments, at least a portion of the first semiconductor package is in contact with at least a portion of the second semiconductor package. The method may further comprise a third semiconductor package and a fourth semiconductor package, wherein a corner of the first semiconductor package is within 100 microns (μm) of a corner of each of the second, third, and fourth semiconductor packages. In certain embodiments, the first metal pad comprises a finger extension along the substrate and a least a portion of the solder material is selectively applied to the finger extension before reflowing of the solder material.

In another aspect, a method comprises: providing a substrate with a metal pad; selectively applying a solder material to a first portion of the metal pad and a second portion of the metal pad; mounting a first semiconductor package to the first portion of the metal pad and a second semiconductor package to the second portion of the metal pad, wherein the second semiconductor package is laterally spaced from the first semiconductor package by a first distance; and reflowing the solder material such that the solder material at the first portion of the metal pad and the solder material at the second portion of the metal pad spread toward one another along the metal pad such that the first semiconductor package is laterally spaced from the second semiconductor package by a second distance that is less than the first distance. In certain embodiments, the first semiconductor package and the second semiconductor package comprise light-emitting diode (LED) packages. In certain embodiments, the first semiconductor package and the second semiconductor package comprise at least one of a capacitor, a resistor, a transistor, and a microchip. In certain embodiments, the second distance is less than or equal to 100 microns (μm). In certain embodiments, the second distance is less than or equal to 50 microns (μm). In certain embodiments, at least a portion of the first semiconductor package is in contact with at least a portion of the second semiconductor package. The method may further comprise a third semiconductor package and a fourth semiconductor package, wherein a corner of the first semiconductor package is within 100 microns (μm) of a corner of each of the second, third, and fourth semiconductor packages on the metal pad. In certain embodiments, the metal pad comprises a plurality of finger extensions along the substrate and a least a portion of the solder material is selectively applied to the plurality of finger extensions before reflowing of the solder material.

In another aspect, a semiconductor device comprises: a substrate with a first metal pad on a surface of the substrate, wherein the first metal pad includes a first finger extension along the surface of the submount; a first semiconductor package electrically coupled to the first metal pad by way of a solder material that is arranged between the first metal pad and the first semiconductor material, wherein a first portion of the solder material is arranged between the first semiconductor package and the first finger extension; and a second semiconductor package on the substrate such that a lateral spacing between the first semiconductor package and the second semiconductor package is less than 100 microns (μm). In certain embodiments, at least a portion of the first semiconductor package is in contact with at least a portion of the second semiconductor package. In certain embodiments, the second semiconductor package is mounted on and electrically coupled with the first metal pad; the first metal pad includes a second finger extension along the surface of the substrate; and a second portion of the solder material is arranged between the second semiconductor package and the second finger extension. In certain embodiments, the second semiconductor package is mounted on and electrically coupled to a second metal pad; the second metal pad includes a second finger extension along the surface of the substrate; and a second portion of the solder material is arranged between the second semiconductor package and the second finger extension. In certain embodiments, the substrate includes a via that is registered with the first metal pad, and the via is arranged to at least partially extend into the substrate, wherein a portion of the solder material is arranged within the via. In certain embodiments, a portion of the first metal pad extends within the via. In certain embodiments, the via is thermally coupled with a thermal pad that is on an opposite side of the substrate from the first semiconductor package and the second semiconductor package. In certain embodiments, the first semiconductor package and the second semiconductor package comprise light-emitting diode (LED) packages. In certain embodiments, the first semiconductor package and the second semiconductor package comprise at least one of a capacitor, a resistor, a transistor, and a microchip.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figures 1A, 1B, 2A, 2B:
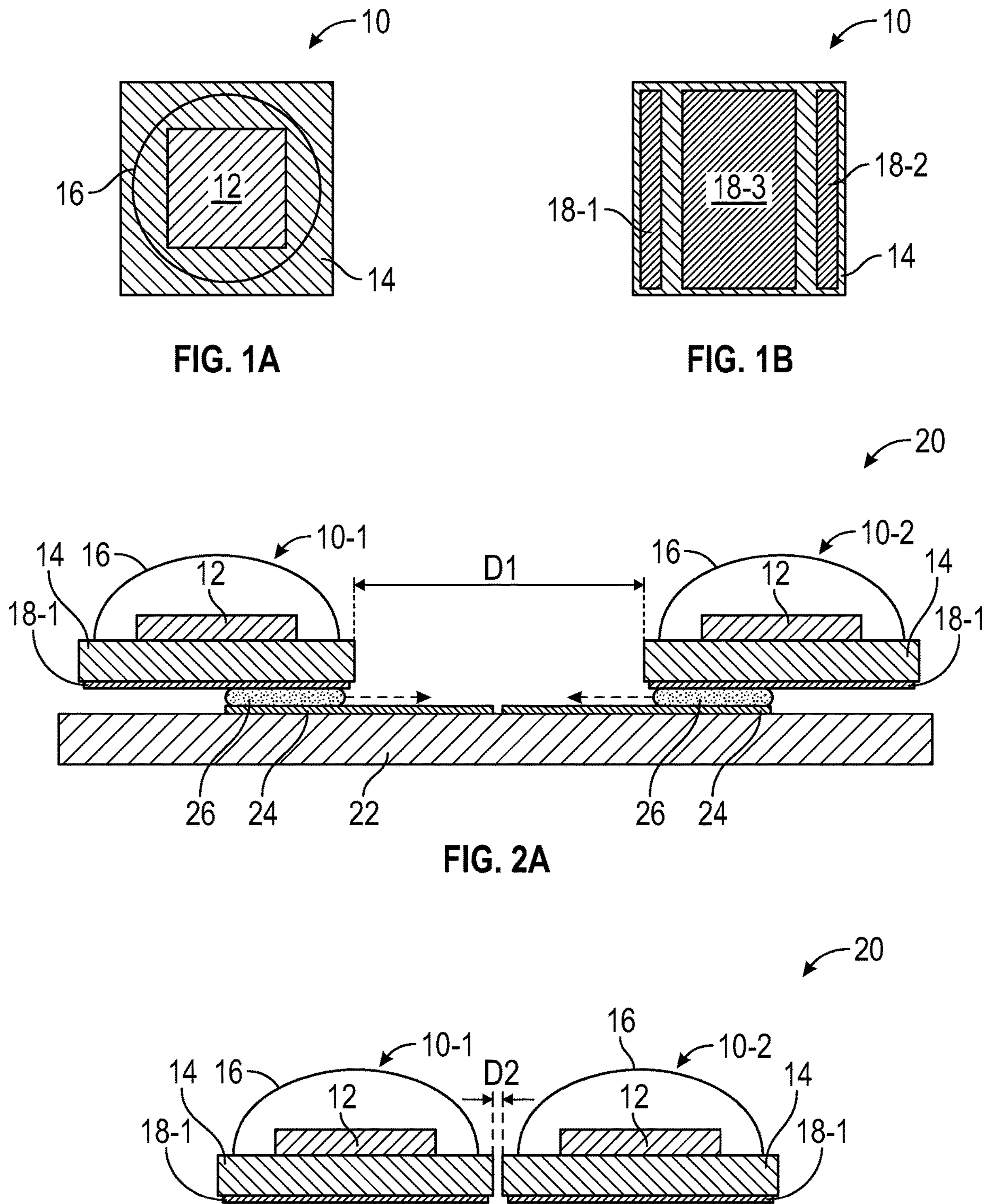
FIG. 1A is a top view of an exemplary light-emitting diode (LED) package that may be arranged with reduced lateral spacing with other LED packages according to principles of the present disclosure.
FIG. 1B is a bottom view of the LED package of FIG. 1A.
FIG. 2A is a side view of a semiconductor device at an initial fabrication step where two LED packages that are similar to the LED package of FIGS. 1A and 1B are arranged as neighbors on a substrate.
FIG. 2B is a side view of the semiconductor device of FIG. 2A after reflowing of solder material such that the two LED packages are arranged with reduced lateral spacing.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to semiconductor packages and more particularly to mounting arrangements for semiconductor packages and related methods. Mounting arrangements include metal pads on substrates and selectively placed solder material on various portions of the metal pads. Semiconductor packages may be initially positioned on the solder material and on portions of the metal pads. During solder reflow, the solder material may spread along portions of the metal pads that were previously uncovered by the solder material and effectively move the semiconductor packages. Specific arrangements of metal pad and selective solder material patterns may be provided that control directions of such movements during reflow. Resulting mounting positions of semiconductor packages may be provided with spacings that are closer than limits of pick and place equipment used to initially position the semiconductor packages.

As modern electronics continue to evolve, discrete semiconductor packages are increasingly being arranged closer to one another and there is always an interest in decreasing a pitch between neighboring semiconductor packages on a common substrate. In the context of light-emitting diode (LEDs), decreased pitch is desired to provide increased resolution of corresponding displays, among other benefits. However, attainable pitches for neighboring LED packages can be limited by conventional assembly techniques. For example, a spacing between neighboring LED packages that is below about 200 microns (μm) or certainly below 150 μm would exceed the limits of conventional pick and place machinery commonly used in the LED industry since the pick and place machinery can only get so close to a previously-mounted LED package when placing the neighboring LED package.

According to aspects of the present disclosure, mounting arrangements and related methods are provided that allow LED packages to be mounted together with spacings of 100 μm or less, or 75 μm or less, or 50 μm or less, or in any range from 0 μm to any of the just described upper boundaries. In certain applications, LED packages may be arranged with a spacing of 0 μm such that at least portions of neighboring LED packages are in contact with one another. Such arrangements may be achieved by selective placement of solder paste on patterned traces of a submount such that the solder paste does not initially cover an entire metal trace on which an LED package will be mounted. The LED package may then be initially placed on the portion of the metal trace that includes the solder paste. During reflow, the solder paste will laterally spread along the remainder of the metal trace and thereby move the LED package laterally to a final mounting position. In this manner, conventional pick and place machinery may arrange neighboring LED packages according to the limits of the machine, such as a spacing of 200 μm, and the neighboring LED packages may be drawn closer together during reflow. While LED packages are discussed in examples below, the principles disclosed herein are readily applicable to any type of semiconductor package, including capacitors, resistors, transistors, and microchips, among others.

FIG. 1A is a top view of an exemplary LED package 10 that may be arranged with reduced lateral spacing with other LED packages according to principles of the present disclosure. FIG. 1B is a bottom view of the LED package 10 of FIG. 1A. The LED package 10 may include an LED chip 12 on a submount 14 and an encapsulant 16 that covers the LED chip 12 on the submount 14. The encapsulant 16 may form a shape of a lens, such as a curved lens as illustrated in FIG. 1A. From the bottom view of FIG. 1B, one or more metal traces 18-1 to 18-3 are arranged on the bottom of the submount 14. In certain aspects, at least two of the metal traces 18-1, 18-2, may embody electrical connections, such as anode and cathode connections for the LED chip 12. While not always present in all LED packages, the metal trace 18-3 may embody a thermal pad that is electrically isolated from the other metal traces 18-1, 18-2. With the arrangement of the metal traces 18-1 to 18-3 on the bottom of the submount 14, the LED package 10 may be suitable configured as a surface mount technology (SMT) package.

FIG. 2A is a side view of a semiconductor device 20 at an initial fabrication step where two LED packages 10-1, 10-2 that are similar to the LED package 10 of FIGS. 1A and 1B are arranged as neighbors on a substrate 22. Depending on the embodiment, the substrate 22 may comprise a dielectric material with metal pads 24 on a surface of the substrate 22. In certain embodiments, the substrate 22 and metal pads 24 may embody a printed circuit board (PCB). In FIG. 2A, the LED packages 10-1, 10-2 are arranged with a lateral distance apart that may be determined by capabilities of conventional pick and place equipment. As illustrated, a solder material 26, such as solder paste, is selectively formed along only portions of the metal pads 24. In certain aspects, the solder material 26 may be selectively applied or patterned by way of a stencil cutout with apertures corresponding to locations of the solder material 26 on the metal pads 24. The LED packages 10-1, 10-2 may then be initially mounted or placed on the solder material 26 of the metal pads 24 in an offset manner. At this initial mounting step, the LED packages 10-1, 10-2 may be laterally spaced from one another by a first distance D1. Since the solder material 26 does not entirely cover the metal pads 24, the solder material 26 will laterally spread along the metal pads 24 during reflow in directions indicated by the superimposed dashed arrows of FIG. 2A. FIG. 2B is a side view of the semiconductor device 20 of FIG. 2A after reflowing of the solder material 26. As illustrated, the lateral spreading of the solder material 26 may move the LED packages 10-1, 10-2 toward each other to a final mounting position that has reduced laterally spacing, or a second distance D2 that is less than the first distance D1 of FIG. 2A. In this manner, the LED packages 10-1, 10-2 may be arranged closer together than what conventional pick and place equipment would otherwise allow.

The principles described above for achieving reduced spacing between semiconductor packages may be applied to various multiple package layouts. In certain multiple package layouts, metal pad patterns on substrates may be provided to promote movement in specific directions during reflow.

Figure 3A:
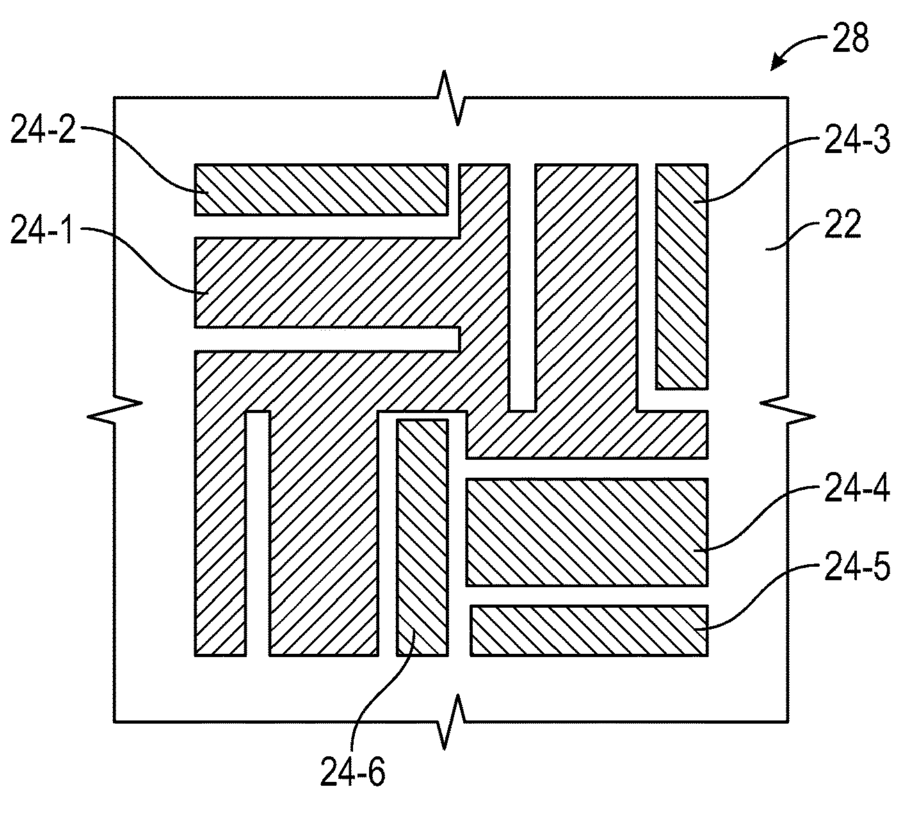
FIG. 3A is a top view of a semiconductor device at an initial fabrication step before semiconductor packages are mounted to the substrate.

FIG. 3A is a top view of a semiconductor device 28 at an initial fabrication step before semiconductor packages are mounted to the substrate 22. Multiple metal pads 24-1 to 24-6 are patterned on the substrate 22. As illustrated, the metal pad 24-1 includes multiple connected fingers or extensions and occupies the largest overall area of the substrate 22 compared to the other metal pads 24-2 to 24-6. In this manner, the metal pad 24-1 may embody a common metal pad that provides a common electrical connection for multiple semiconductor devices while one or more of the other metal pads 24-2 to 24-6 may embody isolated electrical connections for individual ones of the semiconductor devices. By having the metal pad 24-1 as a common electrical connection and one or more of the other metal pads 24-2 to 24-6 as individual electrical connections, later mounted semiconductor packages may be configured for individual control.

Figure 3B:
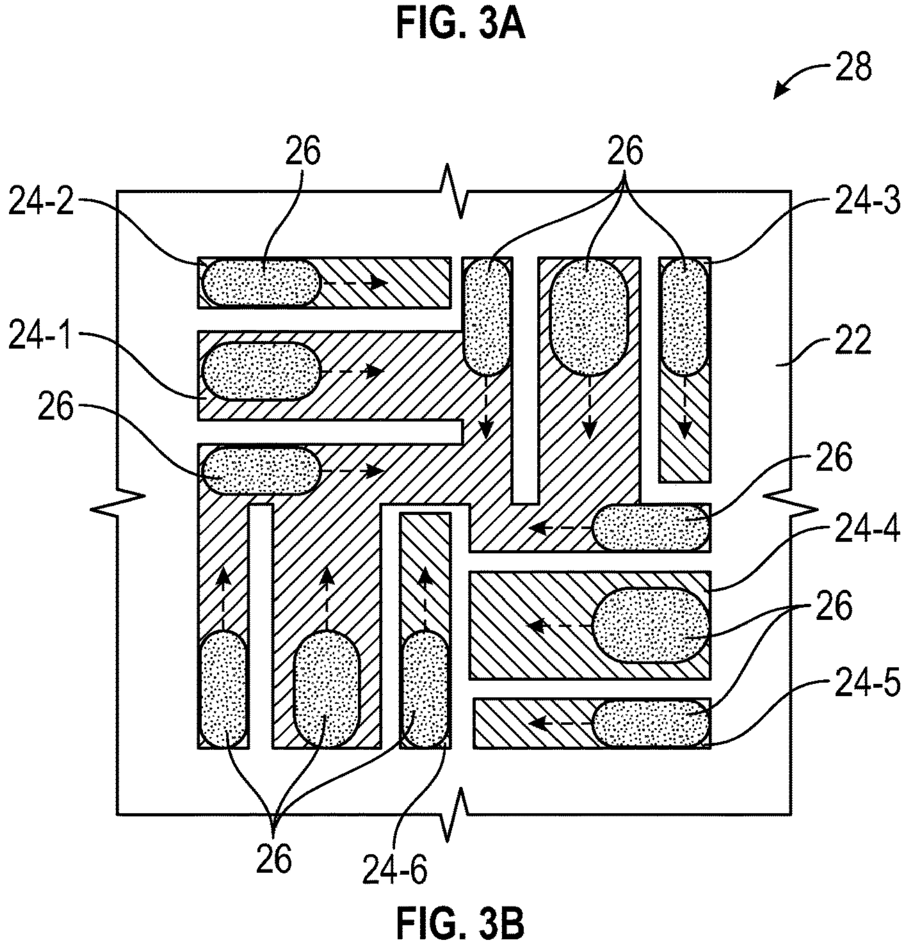
FIG. 3B is a top view of the semiconductor device of FIG. 3A at a subsequent fabrication step after solder material has been selectively applied to portions of metal pads on the substrate.

FIG. 3B is a top view of the semiconductor device 28 of FIG. 3A at a subsequent fabrication step after solder material 26 has been selectively applied to portions of the metal pads 24-1 to 24-6. As illustrated, the solder material 26 may be applied to portions of the metal pads 24-1 to 24-6 that are proximate outside ends of the metal pads 24-1 to 24-6. In this manner, the solder material 26 may spread along each of the metal pads 24-1 to 24-6 in directions as indicated by the superimposed dashed arrows of FIG. 3B, thereby bringing portions of the solder material 26 on each of the metal pads 24-1 to 24-6 closer to one another.

Figure 3C:
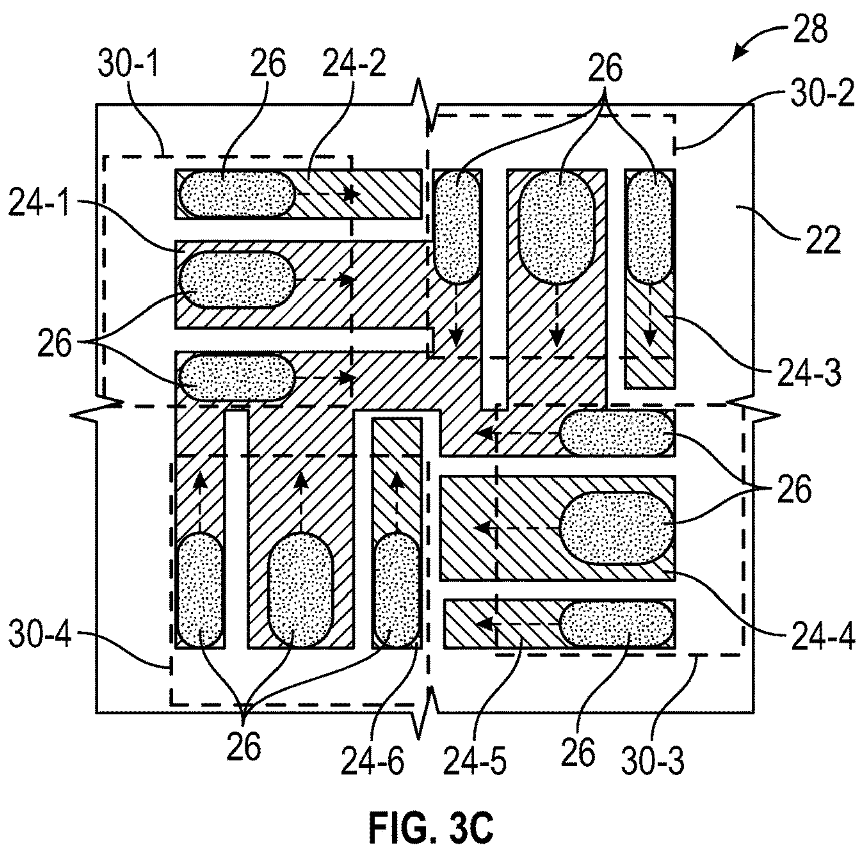
FIG. 3C is a top view of the semiconductor device of FIG. 3B after initial mounting or placement of the semiconductor packages on the substrate.

FIG. 3C is a top view of the semiconductor device 28 of FIG. 3B after initial mounting or placement of semiconductor packages 30-1 to 30-4. For illustrative purposes, the semiconductor packages 30-1 to 30-4 are illustrated with dashed-line boxes in order to show the underlying solder material 26 and metal pads 24-1 to 24-6. In FIG. 3C, the dashed-line boxes indicate locations of initial mounting areas of the semiconductor packages 30-1 to 30-4. As illustrated, the initial mounting positions of the semiconductor packages 30-1 to 30-4 may be offset such that portions of the semiconductor packages 30-1 to 30-4 laterally overhang the metal pads 24-1 to 24-6. As described above, during reflow, the solder material 26 may spread along each of the metal pads 24-1 to 24-6 in directions as indicated by the superimposed dashed arrows. In this manner, the semiconductor packages 30-1 to 30-4 may move according to the dashed arrows during reflow.

Figure 3D:
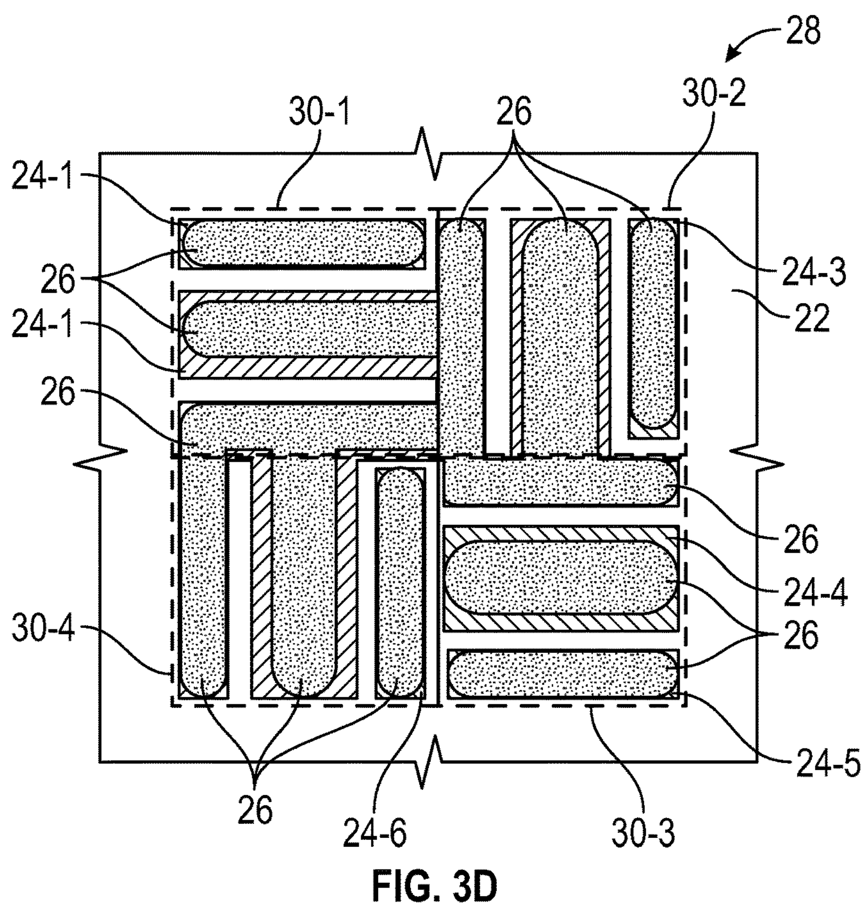
FIG. 3D is a top view of the semiconductor device of FIG. 3C after reflowing of the solder material.

FIG. 3D is a top view of the semiconductor device 28 of FIG. 3C after reflowing of the solder material 26. As illustrated, lateral spreading of the solder material 26 may move the semiconductor packages 30-1 to 30-4 toward each other to a final mounting position with reduced spacing. In this manner, the semiconductor packages 30-1 to 30-4 may be arranged closer together than what conventional pick and place equipment would otherwise allow. In particular, for embodiments where four of the semiconductor packages 30-1 to 30-4 are provided, the four semiconductor packages 30-1 to 30-4 may be positioned such that at least one corner of one semiconductor package 30-1 is within 100 μm, or within 75 μm, or within 50 μm, or within 0 μm between corners of at least three other semiconductor packages 30-2 to 30-4. As described above, a 0 μm spacing refers to an arrangement were at least portions of neighboring semiconductor devices 30-1 to 30-4 are in contact with one another.

Figure 4A:
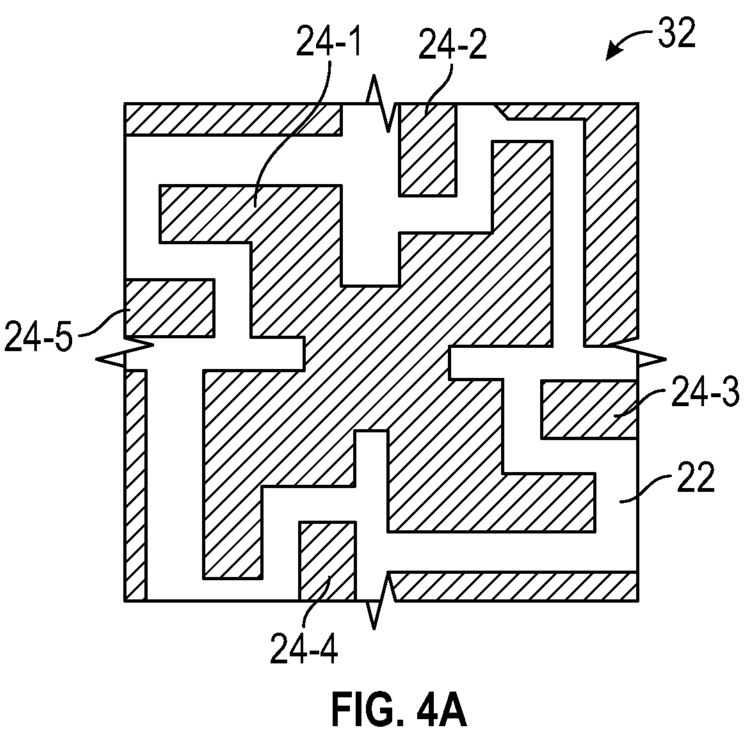
FIG. 4A is a top view of a semiconductor device at an initial fabrication step that is similar to the semiconductor device of FIG. 3A and illustrates another arrangement of metal pads.

FIG. 4A is a top view of a semiconductor device 32 at an initial fabrication step that is similar to the semiconductor device 28 of FIG. 3A and illustrates another arrangement of metal pads 24-1 to 24-5. In this manner, the metal pad 24-1 includes multiple connected fingers or extensions and occupies the largest overall area of the substrate 22 compared to the other metal pads 24-2 to 24-5. Accordingly, the metal pad 24-1 may be configured as a common metal pad for multiple semiconductor devices. The remaining metal pads 24-2 to 24-5 may provide individual electrical connections for individual semiconductor devices as described above.

Figure 4B:
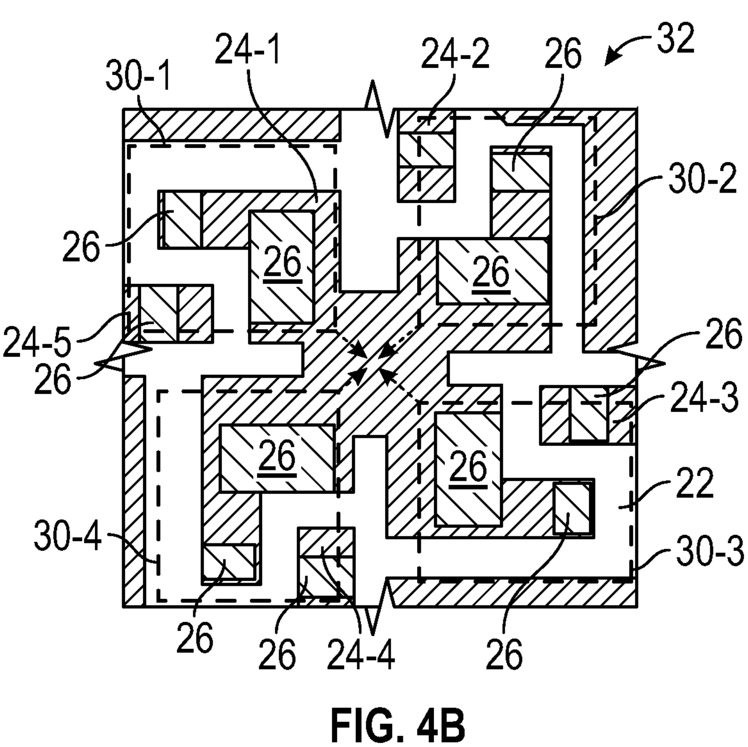
FIG. 4B is a top view of the semiconductor device of FIG. 4A at a subsequent fabrication step after solder material has been selectively applied to portions of the metal pads and semiconductor packages have been placed on the solder material.

FIG. 4B is a top view of the semiconductor device 32 of FIG. 4A at a subsequent fabrication step after solder material 26 has been selectively applied to portions of the metal pads 24-1 to 24-5 and semiconductor packages 30-1 to 30-4 have been placed on the solder material 26. As with FIG. 3C, the semiconductor packages 30-1 to 30-4 are illustrated with dashed-line boxes in order to show the underlying solder material 26 and metal pads 24-1 to 24-5. As illustrated, the solder material 26 may be selectively placed at multiple discrete locations of the metal pad 24-1. For example, the portion of the metal pad 24-1 that is beneath the semiconductor package 30-1 includes two discrete portions of the solder material 26 where one of the portions is smaller and arranged on a finger extension of the metal pad 24-1. During reflow, the smaller solder material 26 on the finger extension of the metal pad 24-1 will flow along the finger extension and toward the larger portion of the metal pad 24-1 in a direction that is from left-to-right in FIG. 4B. A portion of the larger solder material 26 on the metal pad 24-1 beneath the semiconductor package 30-1 may spread toward a center of the metal pad 24-1. In this manner, the semiconductor package 30-1 may move toward the center of the metal pad 24-1 during reflow as indicated by the superimposed dashed arrow. In a similar manner, the other semiconductor packages 30-2 to 30-4 may move during reflow such that the semiconductor packages 30-1 to 30-4 all converge toward one another at a center of the metal pad 24-1.

Figure 4C:
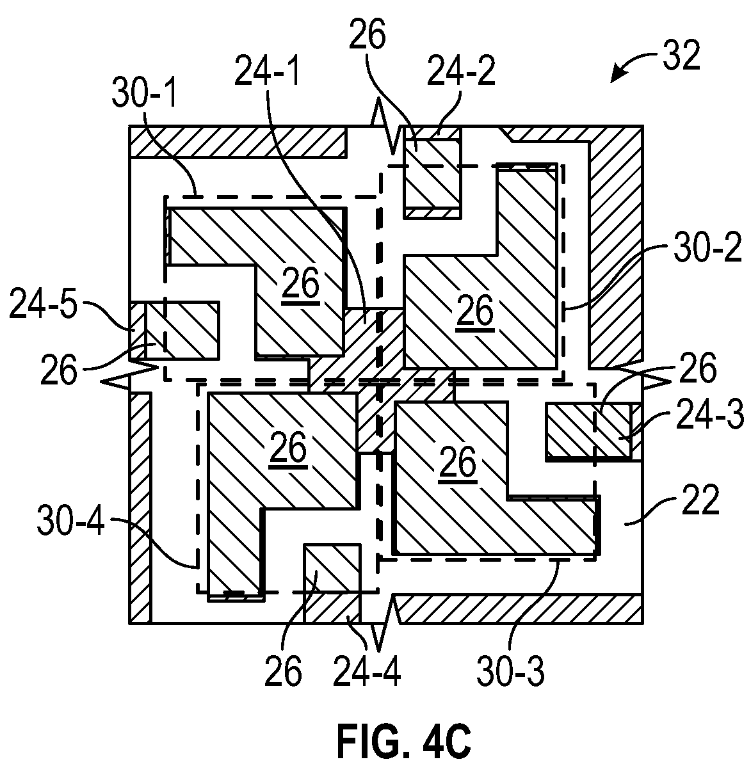
FIG. 4C is a top view of the semiconductor device of FIG. 4B after reflowing of the solder material such that the semiconductor packages are arranged with reduced lateral spacing.

FIG. 4C is a top view of the semiconductor device 32 of FIG. 4B after reflowing of the solder material 26. As illustrated, lateral spreading of the solder material 26 may move the semiconductor packages 30-1 to 30-4 toward each other to converge at a final mounting position with reduced spacing. As further illustrated in FIG. 4C, the solder material 26 spreads along a greater portion of the metal pads 24-1 to 24-5.

Figure 5A:
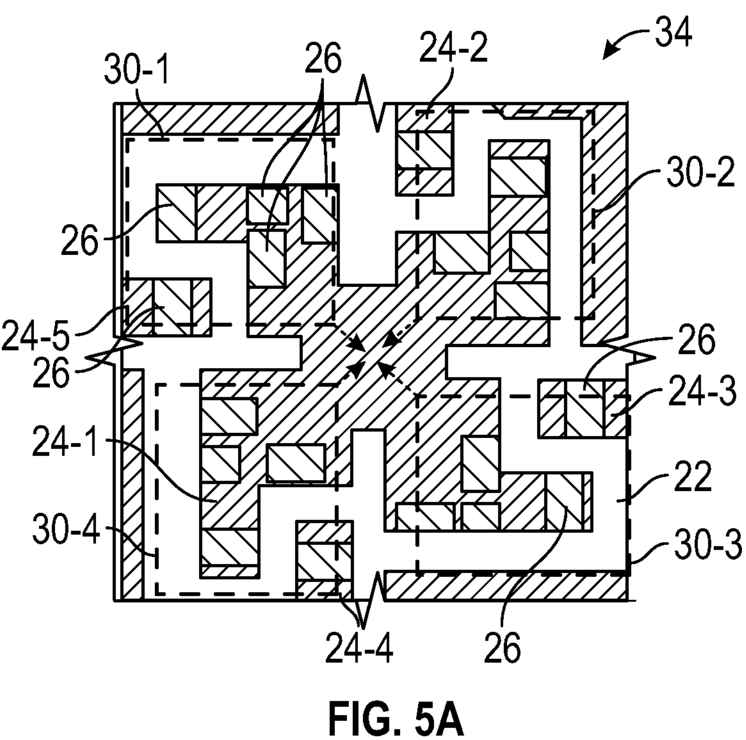
FIG. 5A is a top view of a semiconductor device at a fabrication step that is similar to the semiconductor device of FIG. 4B and illustrates another arrangement of solder material.
Figure 5B:
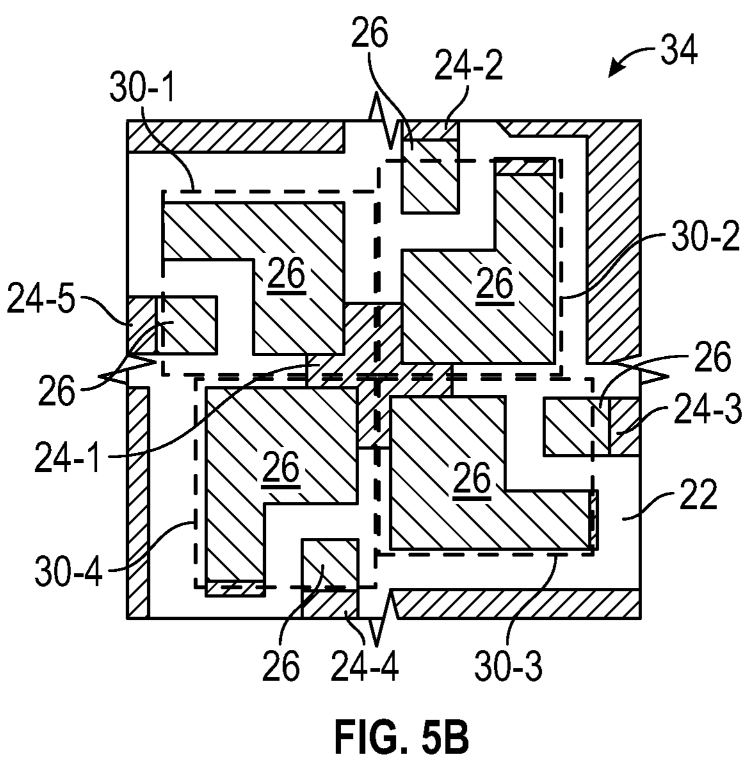
FIG. 5B is a top view of the semiconductor device of FIG. 5A after reflowing of the solder material such that the semiconductor packages are arranged with reduced lateral spacing.

FIG. 5A is a top view of a semiconductor device 34 at a fabrication step that is similar to the semiconductor device 28 at the fabrication step of FIG. 4B and illustrates another arrangement of solder material 26. In FIG. 5A, even more discrete portions of the solder material 26 may be arranged on the metal pads 24-1 to 24-5 beneath each of the semiconductor packages 30-1 to 30-4. For example, four discrete regions of solder material 26 are provided beneath each of the semiconductor packages 30-1 to 30-4. By providing even more discrete portions of the solder material 26, the reflow action of the solder material 26 may promote movement of the semiconductor packages 30-1 to 30-4 with increased precision along the metal pads 24-1 to 24-5. FIG. 5B is a top view of the semiconductor device 34 of FIG. 5A after reflowing of the solder material 26. In a similar manner as described above, lateral spreading of the solder material 26 during reflow may move the semiconductor packages 30-1 to 30-4 toward each other to converge at a final mounting position with reduced spacing. The placement of the discrete regions of solder material 26 may provide increased control of the movement of the semiconductor packages 30-1 to 30-4.

Figure 6A:
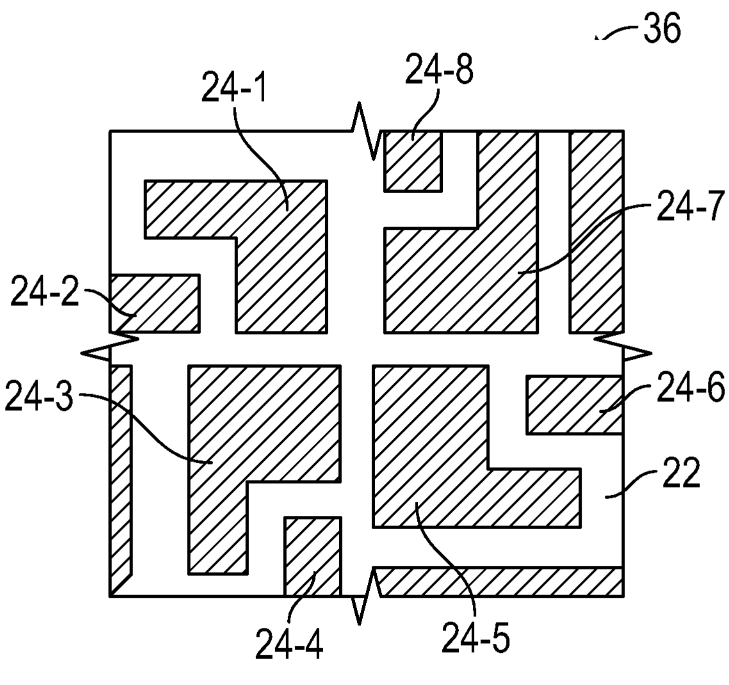
FIG. 6A is a top view of a semiconductor device at a fabrication step that is similar to the semiconductor device of FIG. 4A and illustrates another arrangement of metal pads.

FIG. 6A is a top view of a semiconductor device 36 at a fabrication step that is similar to the semiconductor device 28 at the fabrication step of FIG. 4A and illustrates another arrangement of metal pads 24-1 to 24-8. Instead of having a common metal pad arranged for multiple semiconductor packages, the semiconductor device 36 includes an arrangement of the metal pads 24-1 to 24-8 such that pairs of the metal pads (i.e., 24-1 and 24-2, 24-3 and 24-4, 24-5 and 24-6, and 24-7 and 24-8) are separately arranged to receive individual semiconductor packages. In this manner, each pair of metal pads (24-1 and 24-2, 24-3 and 24-4, 24-5 and 24-6, and 24-7 and 24-8) provides separate anode and cathode connections for each of later mounted semiconductor packages. Notably, certain ones of the metal pads 24-1, 24-3, 24-5, 24-7 include finger extensions as described above for providing enhanced control of movements during reflow.

Figure 6B:
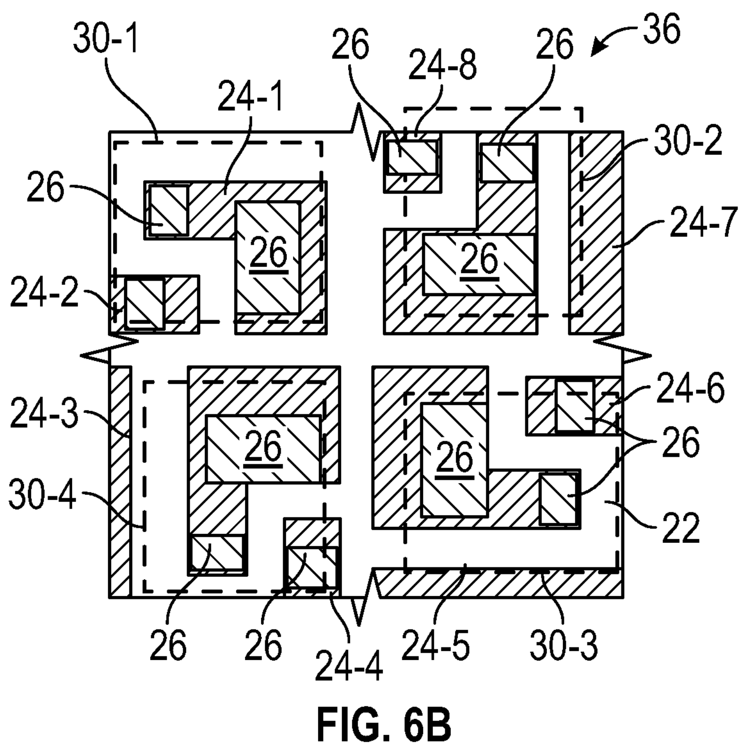
FIG. 6B is a top view of the semiconductor device of FIG. 6A at a subsequent fabrication step after solder material has been selectively applied to portions of the metal pads and semiconductor packages have been placed on the solder material.

FIG. 6B is a top view of the semiconductor device 36 of FIG. 6A at a subsequent fabrication step after solder material 26 has been selectively applied to portions of the metal pads 24-1 to 24-8 and semiconductor packages 30-1 to 30-4 have been placed on the solder material 26. As with previous embodiments, the semiconductor packages 30-1 to 30-4 are illustrated with dashed-line boxes in order to show the arrangement of the underlying solder material 26 and metal pads 24-1 to 24-8.

Figure 6C:
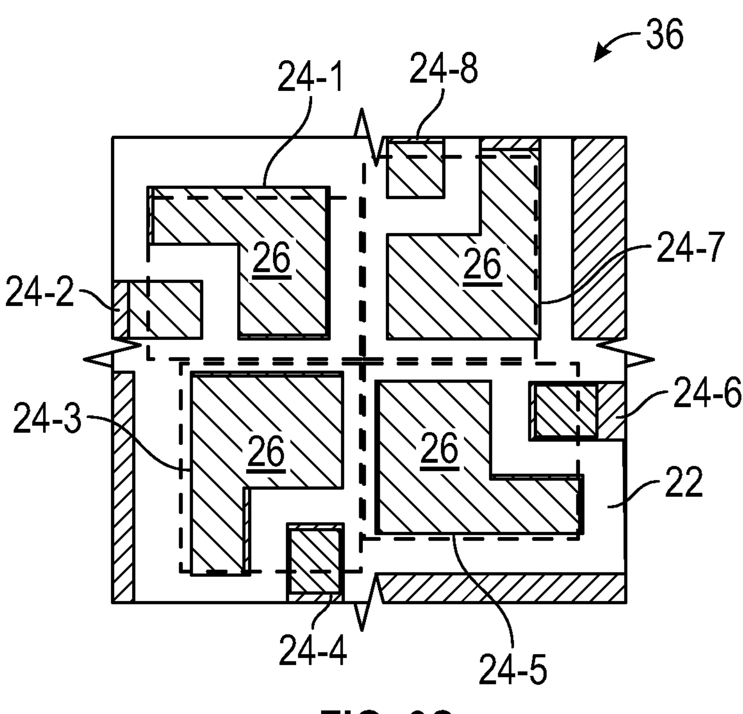
FIG. 6C is a top view of the semiconductor device of FIG. 6B after reflowing of the solder material such that the semiconductor packages are arranged with reduced lateral spacing.

FIG. 6C is a top view of the semiconductor device 36 of FIG. 6B after reflowing of the solder material 26. As with previous embodiments, lateral spreading of the solder material 26 may move the semiconductor packages 30-1 to 30-4 toward each other to converge at a final mounting position with reduced spacing. As further illustrated in FIG. 6C, the solder material 26 spreads along a greater portion of the metal pads 24-1 to 24-8. At the final mounting position for the semiconductor packages 30-1 to 30-4, none of the metal pads 24-1 to 24-8 are continuous at a center point between the semiconductor packages 30-1 to 30-4. Accordingly, a gap in the metal pads 24-1 to 24-8 may continuously extend between next adjacent semiconductor packages 30-1 to 30-4 and portions of the semiconductor packages 30-1 to 30-4 may laterally overhang the metal pads 24-1 to 24-8 along the gap.

Figure 7A:
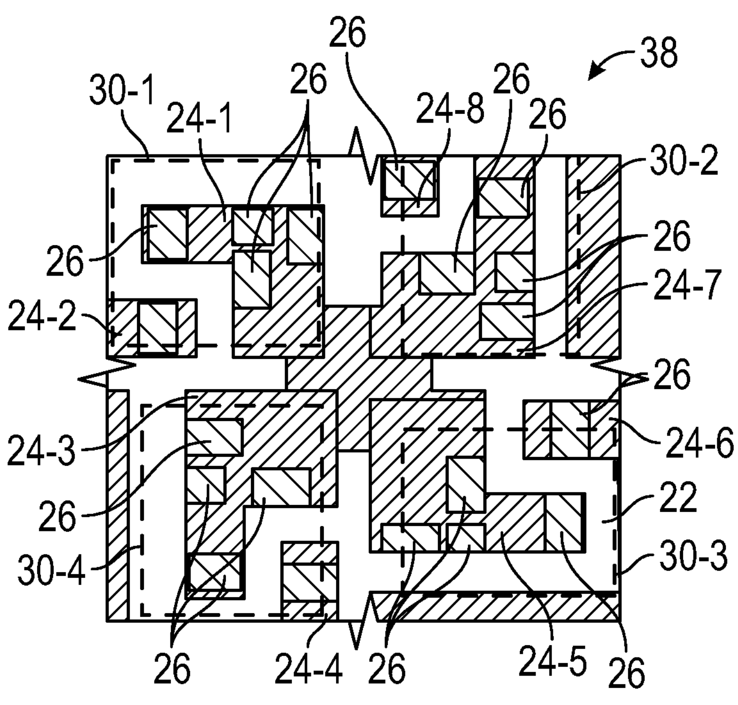
FIG. 7A is a top view of a semiconductor device at a fabrication step that is similar to the semiconductor device of FIG. 6B and illustrates another arrangement of the solder material.
Figure 7B:
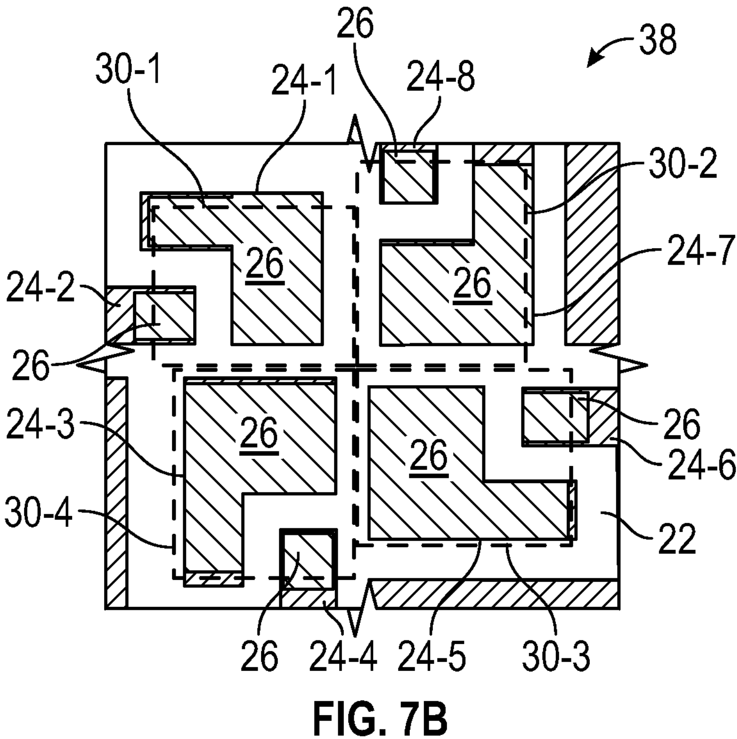
FIG. 7B is a top view of the semiconductor device of FIG. 7A after reflowing of the solder material such that the semiconductor packages are arranged with reduced lateral spacing.

FIG. 7A is a top view of a semiconductor device 38 at a fabrication step that is similar to the semiconductor device 36 at the fabrication step of FIG. 6B and illustrates another arrangement of the solder material 26. In FIG. 7A, even more discrete portions of the solder material 26 may be arranged on the metal pads 24-1 to 24-8 and associated finger extensions beneath each of the semiconductor packages 30-1 to 30-4. As with previous embodiments, providing increased numbers of discrete solder material 26 may promote increased movement precision of the semiconductor packages 30-1 to 30-4 during reflow. FIG. 7B is a top view of the semiconductor device 38 of FIG. 7A after reflowing of the solder material 26. In a similar manner as described above, lateral spreading of the solder material 26 during reflow may move the semiconductor packages 30-1 to 30-4 toward each other to converge at a final mounting position with reduced spacing.

As described above, principles of the present disclosure relate to arrangements of metal pads and selective placement of solder material that promote movement of semiconductor packages during reflow. In further embodiments, additional substrate features may be provided to further enhance and/or control movements of semiconductor packages during reflow. In certain embodiments, a through hole or via may be formed in a surface of the substrate and registered with a metal pad. During reflow, the via may serve to draw solder material into the via, thereby providing increased control for how solder material spreads. In this manner, strategically placed vias may serve to provide enhanced control of associated semiconductor packages during reflow.

Figure 8A:
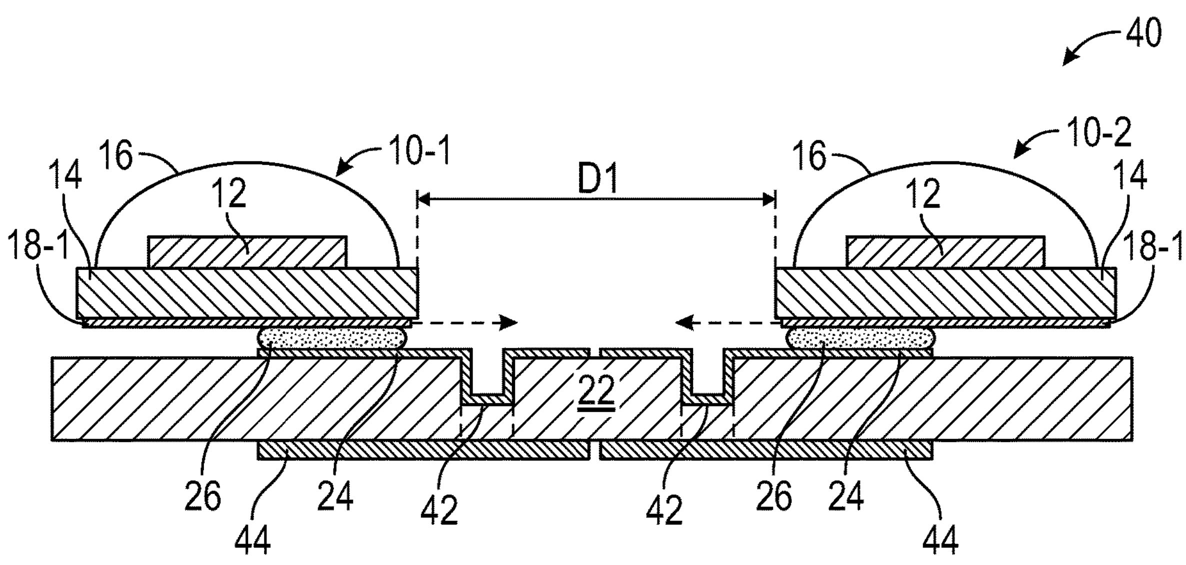
FIG. 8A is a side view of a semiconductor device that is similar to the semiconductor device of FIG. 2A and further includes vias formed in the substrate for enhancing movement of semiconductor packages during reflow.

FIG. 8A is a side view of a semiconductor device 40 that is similar to the semiconductor device 20 of FIG. 2A and further includes vias 42 formed in the substrate 22 for enhancing movement of semiconductor packages 10-1, 10-2 during reflow. In this regard, FIG. 8A represents an initial fabrication step where two LED packages 10-1, 10-2 are arranged as neighbors on a substrate 22. The solder material 26 is selectively formed along only portions of the metal pads 24 as described above. In certain embodiments, the LED packages 10-1, 10-2 may initially be mounted or placed on the solder material 26 of the metal pads 24 in an offset or off-center manner. At this initial mounting step, the LED packages 10-1, 10-2 may be laterally spaced from one another by the first distance D1. As illustrated, the vias 42 may partially extend into the substrate 22. In other embodiments, the vias 42 may entirely extend through the substrate 22 as indicated by the vertical dashed lines to provide electrical and/or thermal coupling to backside metal pads 44. In this regard, the backside metal pads 44 may embody thermal pads or heat sinks for the semiconductor device 40. In certain embodiments, the vias 42 may be plated or otherwise coated with corresponding ones of the metal pads 24. In other embodiments, the metal pads 24 may not extend into the vias 42 and the vias are formed within dielectric materials of the substrate 22.

Figure 8B:
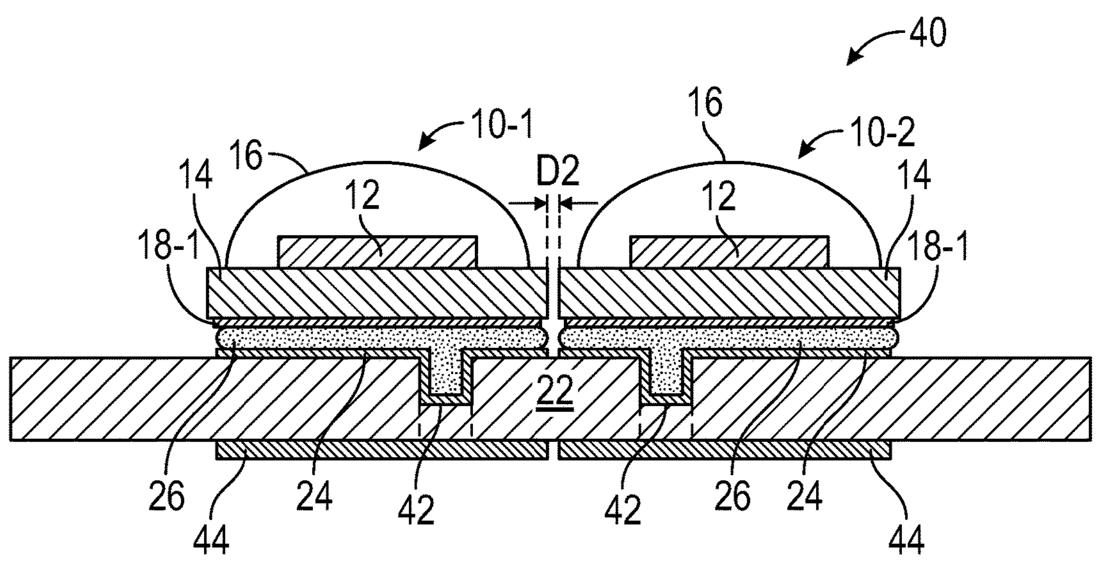
FIG. 8B is a side view of the semiconductor device of FIG. 8A after reflowing of the solder material such that the semiconductor packages are arranged with reduced lateral spacing.

FIG. 8B is a side view of the semiconductor device 40 of FIG. 8A after reflowing of the solder material 26. As illustrated, the lateral spreading of the solder material 26 may move the LED packages 10-1, 10-2 toward each other to a final mounting position that has reduced spacing, or a lateral spacing with a second distance D2 that is less than the first distance D1 of FIG. 8A. During reflow, the solder material 26 may be drawn into the vias 42, thereby encouraging specific movement of the semiconductor packages 10-1, 10-2 in directions toward their final mounting positions.

Figure 9A:
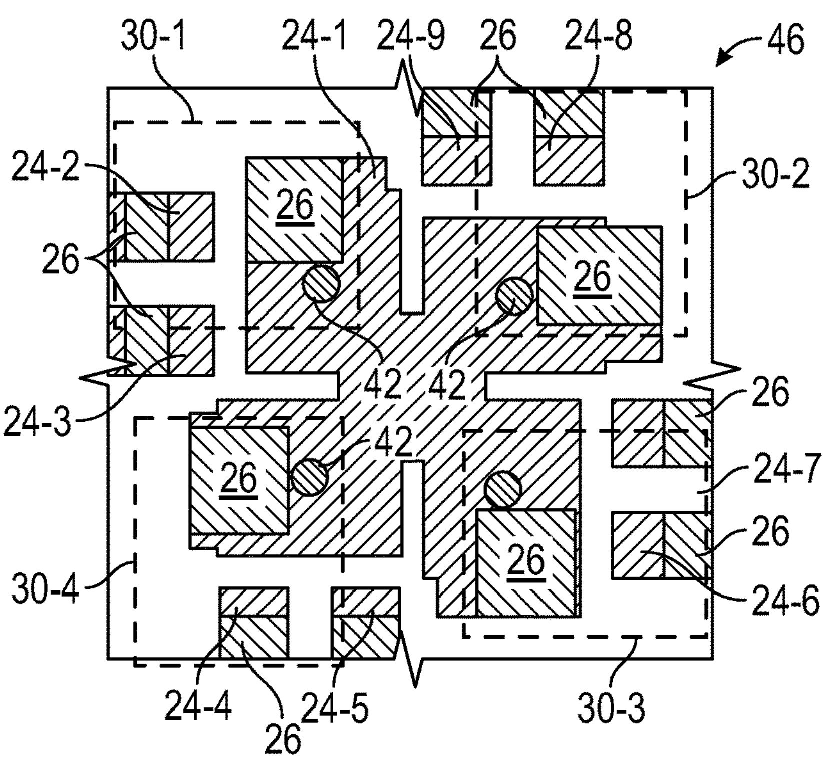
FIG. 9A is a top view of a semiconductor device that is similar to the semiconductor device of FIGS. 8A and 8B at a fabrication step where vias and discrete regions of solder material are arranged to control movement of semiconductor packages.

FIG. 9A is a top view of a semiconductor device 46 that is similar to the semiconductor device 40 of FIGS. 8A and 8B at a fabrication step where vias 42 and discrete regions of solder material 26 are arranged to control movement of semiconductor packages 30-1 to 30-4. In FIG. 9A, the metal pad 24-1 is arranged as a common metal pad in a similar manner as described above for FIG. 4A. However, the principles disclosed are also applicable to other arrangements, such as in FIG. 6A, where no common metal pad is provided. As illustrated in FIG. 9A, the discrete regions of solder material 26 are placed proximate corresponding ones of the vias 42. In this regard, the vias 42 will promote lateral spreading of the solder material 26 during reflow in directions toward the vias 42.

Figure 9B:
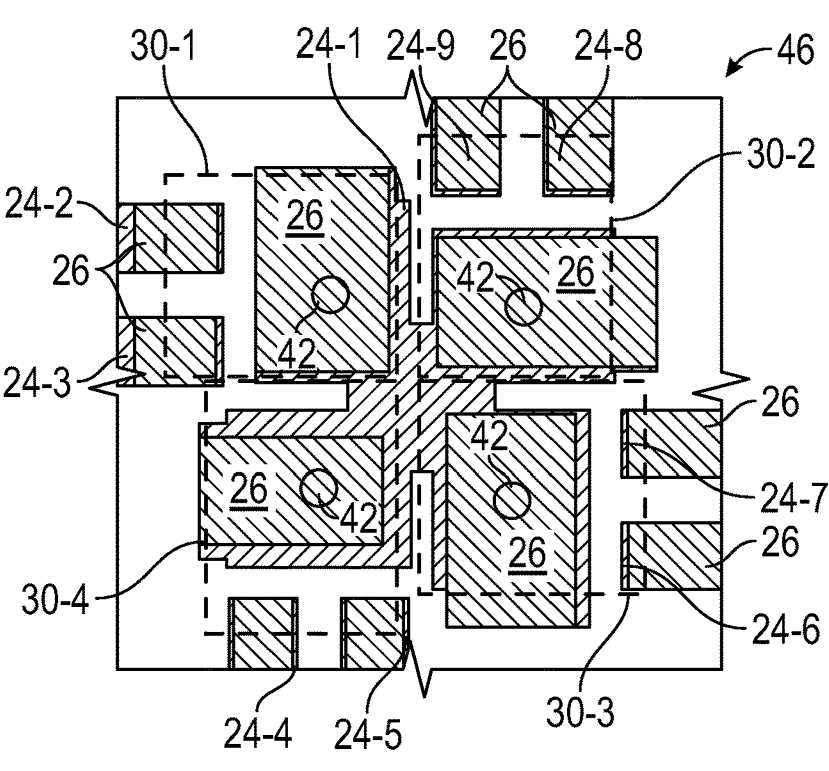
FIG. 9B is a top view of the semiconductor device of FIG. 9A after reflowing of the solder material such that the semiconductor packages are arranged with reduced lateral spacing.

FIG. 9B is a top view of the semiconductor device 46 of FIG. 9A after reflowing of the solder material 26. In a similar manner as described above, lateral spreading of the solder material 26 during reflow and into the vias 42 may move the semiconductor packages 30-1 to 30-4 toward each other to converge at a final mounting position with reduced spacing. The placement of the vias 42 relative to the discrete regions of solder material 26 may provide enhanced control of the movement of the semiconductor packages 30-1 to 30-4.

As described above, aspects of the present disclosure relate to arrangements of semiconductor packages with reduced lateral spacing. In the context of LED packages, such arrangements may be advantageous for providing densely populated LED lighting assemblies and increased contrast in pixelated arrangements for LED display backlighting, such as cell phone screens, computer screens, and television applications. In the context of other types of semiconductor packages, the principles disclosed are applicable to providing densely populated printed circuit board assemblies for use in a variety of applications, including cell phones and/or computer assemblies.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:

providing a substrate with a first metal pad and a second metal pad;

selectively applying a solder material to at least two discrete portions of the first metal pad and a portion of the second metal pad;

mounting a first semiconductor package offset relative to the solder material located at the at least two discrete portions of the first metal pad such that the first semiconductor package laterally overhangs the solder material, and mounting a second semiconductor package offset relative to the solder material of the second metal pad such that the second semiconductor package laterally overhangs the solder material, wherein the second semiconductor package is laterally spaced from the first semiconductor package by a first distance; and reflowing the solder material such that the solder material on the at least two discrete portions of the first metal pad spreads and joins together along the first metal pad and the solder material of the second metal pad spreads along the second metal pad such that the first semiconductor package is laterally spaced from the second semiconductor package by a second distance that is less than the first distance.

2. The method of claim 1, wherein the first semiconductor package and the second semiconductor package comprise light-emitting diode (LED) packages.

3. The method of claim 2, wherein the LED packages are configured as surface mount technology (SMT) packages.

4. The method of claim 1, wherein the first semiconductor package and the second semiconductor package comprise at least one of a capacitor, a resistor, a transistor, and a microchip.

5. The method of claim 1, wherein the second distance is less than or equal to 100 microns (μm).

6. The method of claim 1, wherein the second distance is less than or equal to 50 microns (μm).

7. The method of claim 1, wherein at least a portion of the first semiconductor package is in contact with at least a portion of the second semiconductor package.

8. The method of claim 1, further comprising a third semiconductor package and a fourth semiconductor package, wherein a corner of the first semiconductor package is within 100 microns (μm) of a corner of each of the second, third, and fourth semiconductor packages.

9. The method of claim 1, wherein the first metal pad comprises a finger extension along the substrate and a least a portion of the solder material is selectively applied to the finger extension before reflowing of the solder material.

10. A method comprising:

providing a substrate with a metal pad;

selectively applying a solder material to a first portion of the metal pad and a second portion of the metal pad, wherein the solder material forms at least two discrete regions on the first portion of the metal pad;

mounting a first semiconductor package offset relative to the at least two discrete regions of the solder material on the first portion of the metal pad such that the first semiconductor package laterally overhangs the solder material, and mounting a second semiconductor package offset relative to the solder material on the second portion of the metal pad such that the second semiconductor package laterally overhangs the solder material, wherein the second semiconductor package is laterally spaced from the first semiconductor package by a first distance; and reflowing the solder material such that the solder material at the first portion of the metal pad and the solder material at the second portion of the metal pad spread toward one another along the metal pad such that the first semiconductor package is laterally spaced from the second semiconductor package by a second distance that is less than the first distance, and the at least two discrete regions of the solder material on the first portion of the metal pad join together.

11. The method of claim 10, wherein the first semiconductor package and the second semiconductor package comprise light-emitting diode (LED) packages.

12. The method of claim 10, wherein the first semiconductor package and the second semiconductor package comprise at least one of a capacitor, a resistor, a transistor, and a microchip.

13. The method of claim 10, wherein the second distance is less than or equal to 100 microns (μm).

14. The method of claim 10, wherein the second distance is less than or equal to 50 microns (μm).

15. The method of claim 10, wherein at least a portion of the first semiconductor package is in contact with at least a portion of the second semiconductor package.

16. The method of claim 10, further comprising a third semiconductor package and a fourth semiconductor package, wherein a corner of the first semiconductor package is within 100 microns (μm) of a corner of each of the second, third, and fourth semiconductor packages on the metal pad.

17. The method of claim 10, wherein the metal pad comprises a plurality of finger extensions along the substrate and a least a portion of the solder material is selectively applied to the plurality of finger extensions before reflowing of the solder material.

* * * * *